(12) United States Patent
Kaneko et al.

(10) Patent No.: US 7,308,395 B2
(45) Date of Patent: Dec. 11, 2007

(54) SIMULATION CIRCUIT PATTERN EVALUATION METHOD, MANUFACTURING METHOD OF SEMICONDUCTOR INTEGRATED CIRCUIT, TEST SUBSTRATE, AND TEST SUBSTRATE GROUP

(75) Inventors: Hisashi Kaneko, Fujisawa (JP); Motoya Okazaki, Tokyo (JP); Hiroyuki Toshima, Saitama (JP)

(73) Assignee: Kabushiki Kaisha Toshiba, Tokyo (JP)

(\*) Notice: Subject to any disclaimer, the term of this patent is extended or adjusted under 35 U.S.C. 154(b) by 644 days.

(21) Appl. No.: 10/757,415

(22) Filed: Jan. 15, 2004

(65) Prior Publication Data

US 2005/0075854 A1    Apr. 7, 2005

(30) Foreign Application Priority Data

Oct. 2, 2003   (JP) ............................ P2003-344526

(51) Int. Cl.
*G06F 17/50* (2006.01)
*G06F 9/455* (2006.01)
*H01L 21/66* (2006.01)
*G01R 31/26* (2006.01)

(52) U.S. Cl. .............................. 703/14; 703/13; 716/4; 716/11; 716/12; 700/121; 438/14

(58) Field of Classification Search .................. 703/14; 716/4, 11, 12; 700/121; 438/14
See application file for complete search history.

(56) References Cited

U.S. PATENT DOCUMENTS 5,903,011 A       5/1999  Hatanaka
6,040,912 A       3/2000  Zika et al.
6,253,362 B1 *    6/2001  Anand et al. .................. 716/8
6,505,332 B1 *    1/2003  Oda ............................. 716/12
6,582,976 B2 *    6/2003  Watanabe ..................... 438/14
6,975,953 B2 *   12/2005  Kadota ........................ 702/117
7,211,448 B2 *    5/2007  Watanabe ..................... 438/14
2004/0228186 A1* 11/2004  Kadota ........................ 365/202

FOREIGN PATENT DOCUMENTS

JP         10-050785          2/1998

(Continued)

OTHER PUBLICATIONS

Muddu, S. et al. "Repeater and Interconnect Strategies for High-Performance Physical Designs." Proc. XI Brazilian Symposium on IC Design. Sep. 30-Oct. 3, 1998. pp. 226-231.*

(Continued)

*Primary Examiner*—Paul Rodriguez
*Assistant Examiner*—Ayal Sharon
(74) *Attorney, Agent, or Firm*—Finnegan, Henderson, Farabow, Garrett & Dunner, L.L.P.

(57) ABSTRACT

According to an aspect of the present invention, there is provided a simulation circuit pattern evaluation method including: designing an aggregate of simulation circuit patterns, which simulate a circuit pattern of a semiconductor integrated circuit, by combining plural geometrical structure defining parameters respectively having at least two states in such a manner that the respective states appear the same number of times in the respective geometrical structure defining parameters; forming the aggregate of the simulation circuit patterns on a substrate; and evaluating the formed aggregate of the simulation circuit patterns.

12 Claims, 10 Drawing Sheets

FOREIGN PATENT DOCUMENTS

| | | |
|---|---|---|
| JP | 2001-44285 | 2/2001 |
| JP | 2004259894 A * | 9/2004 |

OTHER PUBLICATIONS

Sakanushi, K. et al. "The Quarter-State-Sequence Floorplan Representation." IEEE Transactions on Circuits and Systems I. Mar. 2003. vol. 50, Issue 3, pp. 376-386.*

Hung, W.-L. et al. "Interconnect and Thermal-aware Floorplanning for 3D microprocessors." 7th Int'l Symposium on Quality Electronic Design (ISQED '06). Mar. 27-29, 2006.*

Sarrafzadeh, M. et al. "Single-layer Global Routing." IEEE Transactions on CAD of IC Circuits and Systems. Jan. 1994. vol. 13, Issue 1, pp. 38-47.*

Venkatesan, R. et al. "Optimal n-tier Multilevel Interconnect Architectures for Gigascale Integration (GSI)." IEEE Transactions on VLSI Systems. Dec. 2001. vol. 9, Issue 6, pp. 899-912.*

Kameda, Y. and S. Yorozu. "Automatic Josephson-Transmission-Line Routing for Single-Flux-Quantum Cell-Based Logic Units." IEEE Transactions on Applied Superconductivity. Jun. 2003. vol. 13, Issue 2, pp. 519-522.*

Notice of Reasons for Rejection mailed Sep. 6, 2005, issued by the Japanese Patent Office in counterpart Japanese Application No. 2003-344526 and English translation thereof.

Hitoshi Ohmura, A talk about design of experiment and analysis of variance, Japan Science and Technology Federation, 1984, p. 1-10 and English translation thereof.

U.S. Appl. No. 10/784,939, filed Feb. 25, 2004, to Kadota.

* cited by examiner

SIMULATION CIRCUIT PATTERN EVALUATION METHOD, MANUFACTURING METHOD OF SEMICONDUCTOR INTEGRATED CIRCUIT, TEST SUBSTRATE, AND TEST SUBSTRATE GROUP

CROSS-REFERENCE TO THE INVENTION

This application is based upon and claims the benefit of priority from the prior Japanese Patent Application No. 2003-344526, filed on Oct. 2, 2003; the entire contents of which are incorporated herein by reference.

BACKGROUND OF THE INVENTION

1. Field of the Invention

The present invention relates to a simulation circuit pattern evaluation method for evaluating a simulation circuit pattern which simulates a circuit pattern of a semiconductor integrated circuit, a manufacturing method of the semiconductor integrated circuit for manufacturing the semiconductor integrated circuit by evaluating the simulation circuit pattern, a test substrate having an aggregate of the simulation circuit patterns, and a test substrate group which is composed of a plurality of the test substrates.

2. Description of the Related Art

Conventionally, as a preliminary step to a commercialization of a semiconductor integrated circuit, a simulation circuit pattern or the like is formed and a performance test of elements, an optimization of process conditions or the like is performed, in order to improve the yield (for example, refer to Japanese Patent Laid-open Application No. 2001-44285).

Currently, in an optimization of a process condition for a wiring formation process, regular simulation wiring patterns are respectively formed with different process conditions on plural semiconductor wafers for testing (hereinafter, referred to as a "test wafer"), and these simulation wiring patterns are evaluated to thereby detect optimum process conditions.

Further, aggregates of simulation wiring patterns which mainly have reference states are respectively formed with different process conditions on plural test wafers, and the aggregates of these simulation wiring patterns are evaluated to thereby detect the optimum process conditions. Here, the aggregates of the simulation wiring patterns which mainly have the reference states are formed by combining plural parameters having two or three states as shown in Table 1, but they are formed to have the number of appearances of the reference states to be the maximum. Incidentally, in Table 1, the reference state for a "first layer wiring formation width" is "0.3 µm," for a "first layer wiring formation length" is "20 µm," for a "second layer wiring formation width" is "0.3 µm," for a "second layer wiring formation length" is "20 µm," for a "via hole formation position" is "center position," and for a "via hole miss-alignment" is "0 (zero)."

TABLE 1

| | A | B | C | D | E | F | G |
|---|---|---|---|---|---|---|---|
| No. 1 | 0.3 µm | 20 µm | 0.3 µm | 20 µm | Center | 0 |
| No. 2 | 0.3 µm | 100 µm | 0.3 µm | 20 µm | Center | 0 |
| No. 3 | 0.3 µm | 200 µm | 0.3 µm | 20 µm | Center | 0 |
| No. 4 | 0.3 µm | 20 µm | 1.0 µm | 20 µm | Center | 0 |
| No. 5 | 0.3 µm | 20 µm | 5.0 µm | 20 µm | Center | 0 |
| No. 6 | 0.3 µm | 20 µm | 0.3 µm | 100 µm | Center | 0 |
| No. 7 | 0.3 µm | 20 µm | 0.3 µm | 200 µm | Center | 0 |

TABLE 1-continued

| | A | B | C | D | E | F | G |
|---|---|---|---|---|---|---|---|
| No. 8 | 0.3 µm | 20 µm | 0.3 µm | 20 µm | End | 0 |
| No. 9 | 0.3 µm | 20 µm | 0.3 µm | 20 µm | End | 10 |
| No. 10 | 0.3 µm | 20 µm | 0.3 µm | 20 µm | End | 30 |
| No. 11 | 1.0 µm | 20 µm | 0.3 µm | 20 µm | Center | 0 |
| No. 12 | 1.0 µm | 100 µm | 0.3 µm | 20 µm | Center | 0 |
| No. 13 | 1.0 µm | 200 µm | 0.3 µm | 20 µm | Center | 0 |
| No. 14 | 1.0 µm | 20 µm | 1.0 µm | 20 µm | Center | 0 |
| No. 15 | 1.0 µm | 20 µm | 5.0 µm | 20 µm | Center | 0 |
| No. 16 | 1.0 µm | 20 µm | 0.3 µm | 100 µm | Center | 0 |
| No. 17 | 1.0 µm | 20 µm | 0.3 µm | 200 µm | Center | 0 |
| No. 18 | 5.0 µm | 20 µm | 0.3 µm | 20 µm | Center | 0 |

A: Simulation wiring patter;
B: First layer wiring formation width;
C: First layer wiring formation length;
D: Second layer wiring formation width;
E: Second layer wiring formation length;
F: Via hole formation position;
G: Via hole miss-alignment However, even in a case that an actual semiconductor integrated circuit is formed with optimum process conditions which are detected by a technique similar to the above-mentioned one, there is a problem of ineffectiveness in improving the yield. This problem is possibly caused by the fact that, when detected process conditions are suitable for some of the wiring patterns, they may not be suitable for the other wiring patterns since wiring patterns in various shapes exist on a semiconductor integrated circuit to be actually commercialized. Accordingly, it is conceivable to form an aggregate of simulation wiring patterns which simulate all the wiring patterns used for the semiconductor integrated circuit. However, the formation of the aggregate of the simulation wiring patterns which simulate all the wiring patterns results in numerous simulation wiring patterns, and thus it is impractical.

BRIEF SUMMARY OF THE INVENTION

According to an aspect of the present invention, there is provided a simulation circuit pattern evaluation method including: designing an aggregate of simulation circuit patterns, which simulate a circuit pattern of a semiconductor integrated circuit, by combining plural geometrical structure defining parameters respectively having at least two states in such a manner that the respective states appear the same number of times in the respective geometrical structure defining parameters; forming the aggregate of the simulation circuit patterns on a substrate; and evaluating the formed aggregate of the simulation circuit patterns.

According to another aspect of the present invention, there is provided a manufacturing method of a semiconductor integrated circuit including: designing an aggregate of simulation circuit patterns, which simulate a circuit pattern of a semiconductor integrated circuit, by combining plural geometrical structure defining parameters respectively having at least two states in such a manner that the respective states appear the same number of times in the respective geometrical structure defining parameters; forming the aggregate of the simulation circuit patterns on each of plural substrates with a process condition which is different for each of the substrates; detecting a process condition which is suitable for the aggregate of the simulation circuit patterns by separately evaluating the formed aggregate of the simulation circuit patterns on each of the substrates; and forming the circuit pattern with the detected process condition.

According to still another aspect of the present invention, there is provided a test substrate including an aggregate of simulation circuit patterns which is formed by combining plural geometrical structure defining parameters respectively having at least two states in such a manner that the respective states appear the same number of times in the respective geometrical structure defining parameters, the aggregate of the simulation circuit patterns simulating a circuit pattern of a semiconductor integrated circuit.

According to yet another aspect of the present invention, there is provided a test substrate group which is composed of plural test substrates respectively including an aggregate of simulation circuit patterns which is formed by combining plural geometrical structure defining parameters respectively having at least two states in such a manner that the respective states appear the same number of times in the respective geometrical structure defining parameters, the aggregate of the simulation circuit patterns simulating a circuit pattern of a semiconductor integrated circuit, the aggregate of the simulation circuit patterns being formed with a process condition which is different for each of the test substrate.

DETAILED DESCRIPTION OF THE INVENTION

First Embodiment

Figure 1:
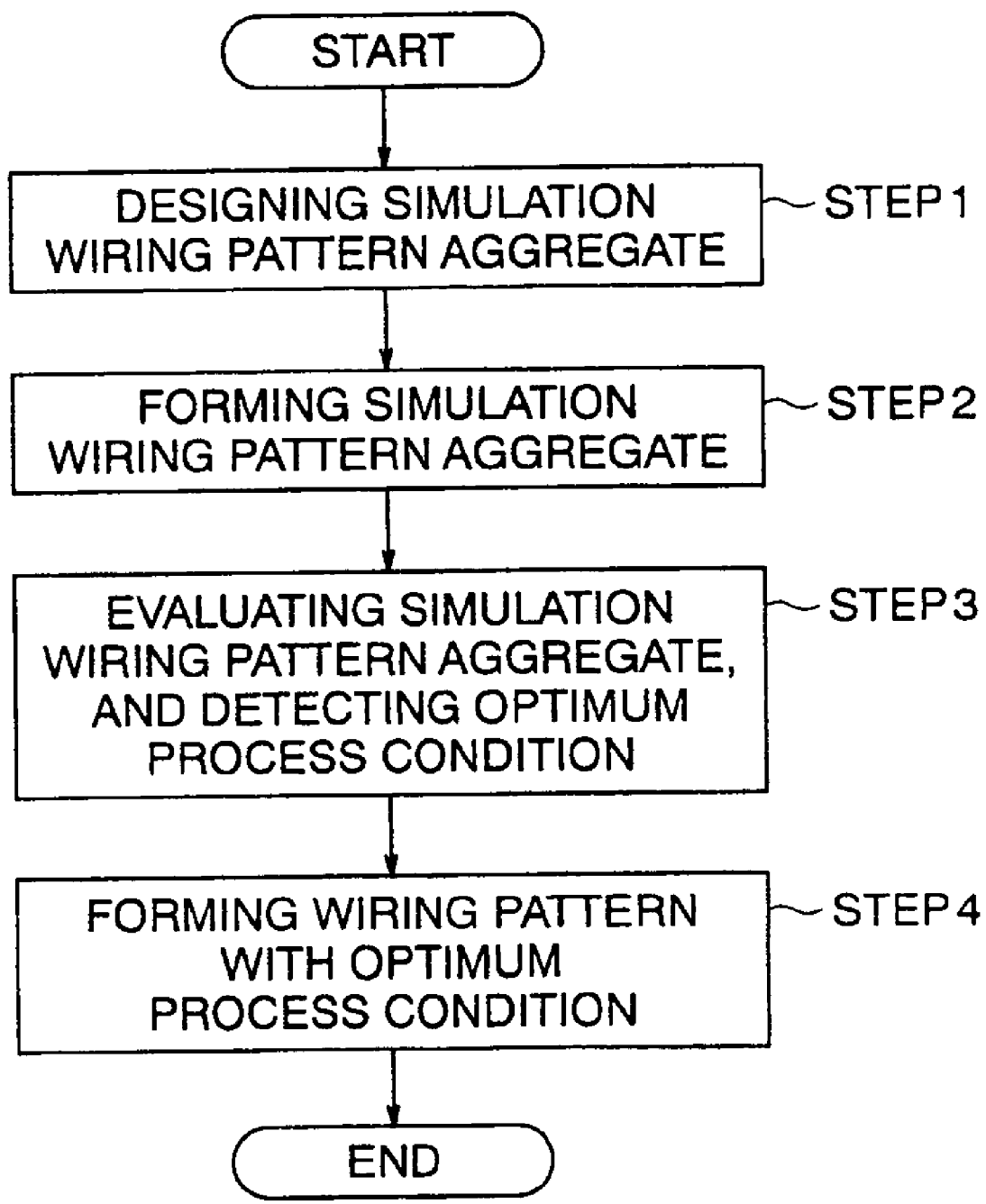
FIG. 1 is a flow chart showing a flow of a wiring formation process of a semiconductor integrated circuit according to a first embodiment.

Hereinafter, a first embodiment will be explained. FIG. 1 is a flow chart showing a flow of a wiring formation process of a semiconductor integrated circuit according to this embodiment.

First, an aggregate of simulation wiring patterns (hereinafter, referred to as a "simulation wiring pattern aggregate") which simulate a wiring pattern of a semiconductor integrated circuit is designed (Step 1).

The simulation wiring pattern aggregate is designed by combining plural parameters which define a geometrical structure in a wiring formation process. Table 2 represents combinations of the plural parameters.

TABLE 2

| A | B | C | D | E | F | H | I | J |
|---|---|---|---|---|---|---|---|---|
| No. 1 | 0.3 μm | 20 μm | 0.3 μm | 20 μm | c/c | bs/bs | 10 μm | Yes |
| No. 2 | 1.0 μm | 100 μm | 1.0 μm | 100 μm | s/c | bs/bs | 50 μm | Yes |
| No. 3 | 5.0 μm | 200 μm | 5.0 μm | 200 μm | s/s | bs/bs | 100 μm | Yes |
| No. 4 | 0.3 μm | 20 μm | 1.0 μm | 100 μm | s/s | bs/os | 100 μm | Yes |
| No. 5 | 1.0 μm | 100 μm | 5.0 μm | 200 μm | c/c | bs/os | 10 μm | Yes |
| No. 6 | 5.0 μm | 200 μm | 0.3 μm | 20 μm | s/c | bs/os | 50 μm | Yes |
| No. 7 | 0.3 μm | 100 μm | 0.3 μm | 200 μm | s/c | os/os | 100 μm | Yes |

TABLE 2-continued

| A | B | C | D | E | F | H | I | J |
|---|---|---|---|---|---|---|---|---|
| No. 8 | 1.0 μm | 200 μm | 1.0 μm | 20 μm | s/s | os/os | 10 μm | Yes |
| No. 9 | 5.0 μm | 20 μm | 5.0 μm | 100 μm | c/c | os/os | 50 μm | Yes |
| No. 10 | 0.3 μm | 200 μm | 5.0 μm | 100 μm | s/c | bs/bs | 10 μm | No |
| No. 11 | 1.0 μm | 20 μm | 0.3 μm | 200 μm | s/s | bs/bs | 50 μm | No |
| No. 12 | 5.0 μm | 100 μm | 1.0 μm | 20 μm | c/c | bs/bs | 100 μm | No |
| No. 13 | 0.3 μm | 100 μm | 5.0 μm | 20 μm | s/s | bs/bs | 50 μm | No |
| No. 14 | 1.0 μm | 200 μm | 0.3 μm | 100 μm | c/c | bs/os | 100 μm | No |
| No. 15 | 5.0 μm | 20 μm | 1.0 μm | 200 μm | s/c | bs/os | 10 μm | No |
| No. 16 | 0.3 μm | 200 μm | 1.0 μm | 200 μm | c/c | os/os | 50 μm | No |
| No. 17 | 1.0 μm | 20 μm | 5.0 μm | 20 μm | s/c | os/os | 100 μm | No |
| No. 18 | 5.0 μm | 100 μm | 0.3 μm | 100 μm | s/s | os/os | 10 μm | No |

A: Simulation wiring patter;
B: First layer wiring formation width;
C: First layer wiring formation length;
D: Second layer wiring formation width;
E: Second layer wiring formation length;
F: Via hole formation position;
H: Dummy wiring group formation position;
I: Third layer wiring group formation length;
J: Existence of dummy via hole;
c/c: center/center;
s/c: side/center;
s/s: side/side;
bs/bs: both sides/both sides;
bs/os: both sides/one side;
os/os: one side/one side As shown in Table 2, in this embodiment, eight parameters are used to form a simulation wiring pattern aggregate which is composed of simulation wiring patterns No. 1 to No. 18. As the parameters, "first layer wiring formation width," "first layer wiring formation length," "second layer wiring formation width," "second layer wiring formation length," "via hole formation position," "dummy wiring group formation position," "third layer wiring group formation length," and "existence of dummy via hole" are used.

The "first layer wiring formation width" and the "second layer wiring formation width" respectively represent formation widths of a first layer wiring and a second layer wiring. The "first layer wiring formation length" and the "second layer wiring formation length" respectively represent formation lengths of the first layer wiring and the second layer wiring. Incidentally, the second layer wiring is designed to be positioned above the first layer wiring.

The "via hole formation position" represents a formation position of a via hole which connects the first layer wiring and the second layer wiring, and the "dummy wiring group formation position" represents formation positions of a first layer dummy wiring group and a second layer dummy wiring group. The first layer dummy wiring group is an aggregate of first layer dummy wirings formed along the first layer wirings, and the second layer dummy wiring group is an aggregate of second layer dummy wirings formed along the second layer wirings. The first layer dummy wiring group is designed to be formed at the same height as the first layer wirings, and the second layer dummy wiring group is designed to be formed at the same height as the second layer wirings. Incidentally, the first layer dummy wiring group and the second layer dummy wiring group are designed to overlap each other.

The "third layer wiring group formation length" represents a length of one side of the third layer wiring group, which is an aggregate of the third layer wirings and is formed in a square, and the "existence of dummy via hole" represents whether a via hole to connect the first layer dummy wiring and the second layer dummy wiring exists or not. The third layer wiring group is designed to be positioned above the second layer wiring.

Each of the parameters has at least two states. The "first layer wiring formation width" and the "second layer wiring formation width" respectively have three states: "0.3 µm," "1.0 µm" and "5.0 µm." The "first layer wiring formation length" and the "second layer wiring formation length" respectively have three states, "20 µm," "100 µm" and "200 µm."

The "via hole formation position" has three states: "center/center" representing that the via hole is formed on the center of the first layer wiring and on the center of the second layer wiring; "side/center" representing that the via hole is formed on a side of the first layer wiring and on the center of the second layer wiring; and "side/side" representing that the via hole is formed on the side of the first layer wiring and on a side of the second layer wiring.

The "dummy wiring group formation position" has three states: "both sides/both sides" representing that the first layer dummy wiring group is formed on both sides of the first layer wiring, and the second layer dummy wiring group is formed on both sides of the second layer wiring; "both sides/one side" representing that the first layer dummy wiring group is formed on the both sides of the first layer wiring, and the second layer dummy wiring group is formed on one side of the second layer wiring; and "one side/one side" representing that the first layer dummy wiring group is formed on one side of the first layer wiring, and the second layer dummy wiring group is formed on the one side of the second layer wiring.

The "third layer wiring group formation length" has three states: "10 µm," "50 µm" and "100 µm." The "existence of dummy via hole" has two states: "yes" representing that the dummy via hole is formed; and "no" representing that the dummy via hole is not formed.

The respective states appear the same number of times in the respective parameters. For example, in the "first layer wiring formation width," the states "0.3 µm," "1.0 µm" and "5.0 µm" respectively appear six times, and in the "first layer wiring formation length," the states "20 µm," "100 µm," and "200 µm" respectively appear six times. In the other parameters, "second layer wiring formation width," "second layer wiring formation length," "via hole formation position," "dummy wiring group formation position," "third layer wiring group formation length," and "existence of dummy via hole," the respective states also appear the same number of times. Incidentally, in the case of the "existence of dummy via hole," the states "yes" and "no" respectively appear nine times.

Figure 2:
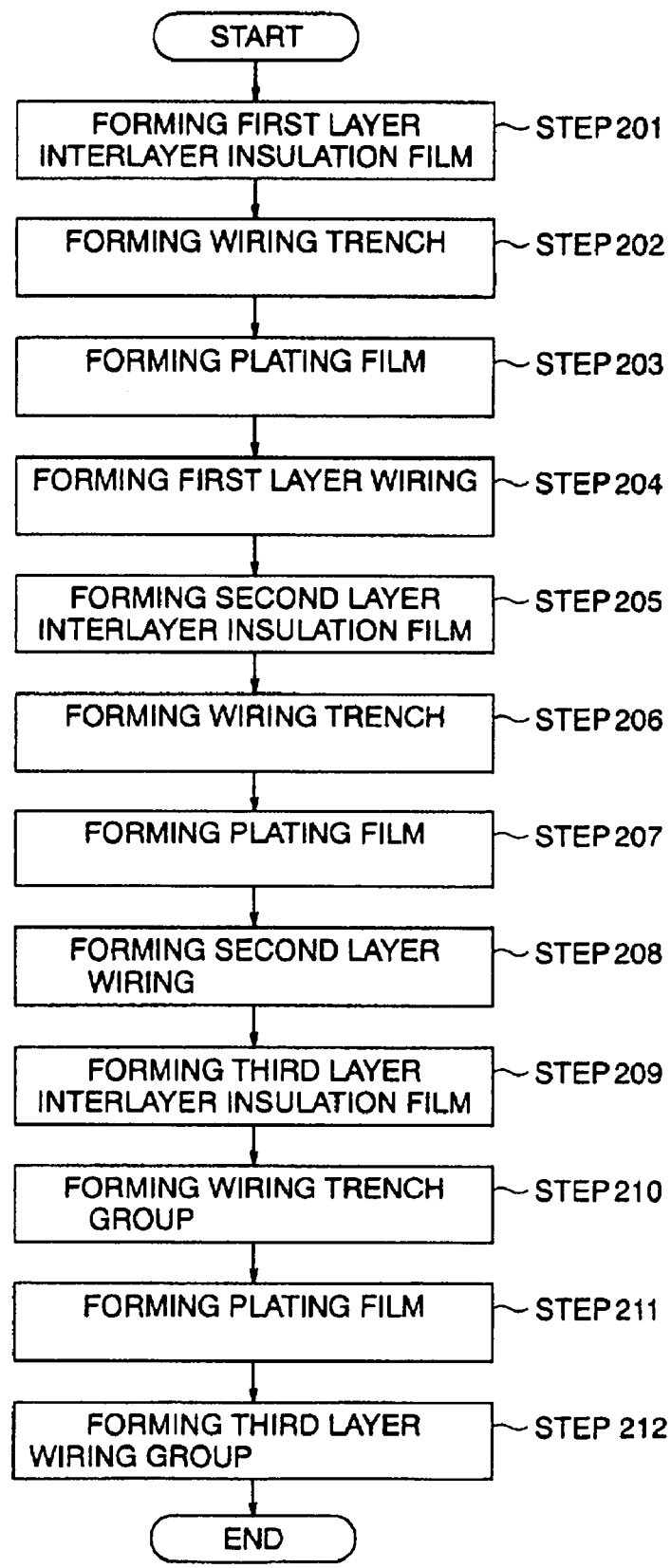
FIG. 2 is a flow chart showing a flow of a simulation wiring pattern formation process according to the first embodiment.

Next, the designed simulation wiring pattern aggregate is formed on test wafers (test substrates) (Step 2). FIG. 2 is a flow chart showing a flow of a simulation wiring pattern formation process according to this embodiment, FIG. 3A to FIG. 3L are schematic process views representing states when forming the simulation wiring pattern No. 6 according to this embodiment, and FIG. 4 is a schematic plan view of the simulation wiring patterns No. 1 to No. 18 according to this embodiment.

When forming the simulation wiring pattern aggregate, plural test wafers (test substrates) are prepared, and the simulation wiring pattern aggregate is formed on each of the test wafers with a process condition which is different for each of the test wafers. Incidentally, 40 chips are formed on one test wafer, and 80 simulation wiring pattern aggregates are formed on one chip.

Figure 3A:
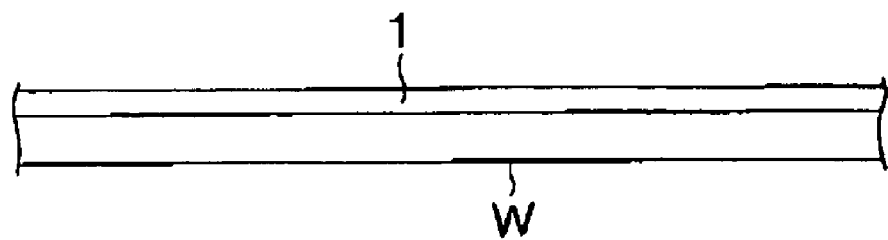
FIG. 3A to FIG. 3L are schematic process views representing states when forming a simulation wiring pattern No. 6 according to the first embodiment.
Figure 4:
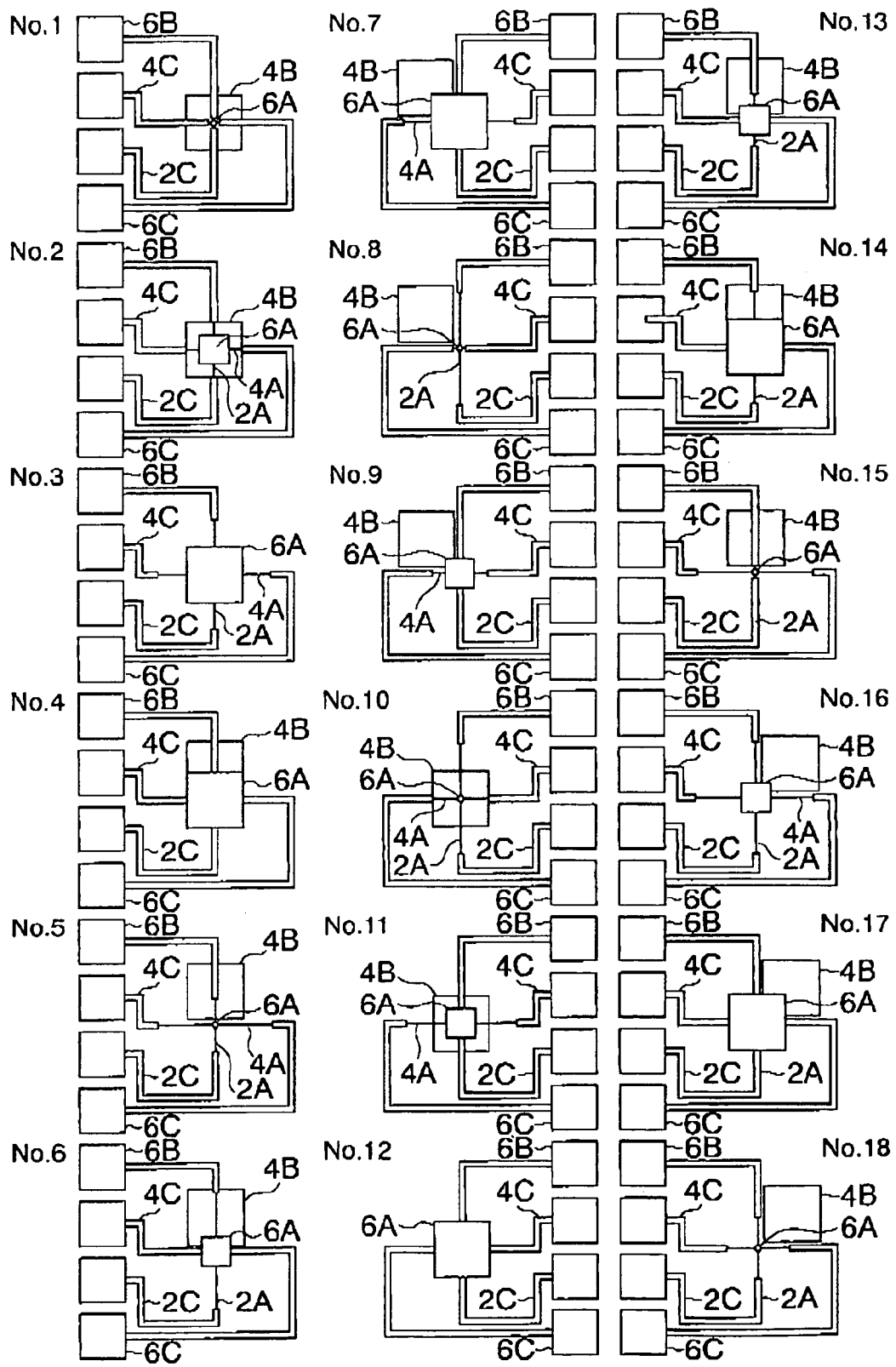
FIG. 4 is a schematic plan view of simulation wiring patterns No. 1 to No. 18 according to the first embodiment.

As shown in FIG. 3A, a first layer interlayer insulation film 1 is formed on a test wafer W by Chemical Vapor Deposition (CVD) or a coating method for example (Step 201). The first layer interlayer insulation film 1 is, for example, composed of a low dielectric constant insulation material. An example of such a low dielectric constant insulation material is SiOC, SiOF, porous silica, PAE (polyarylether), or the like.

Figure 3B:
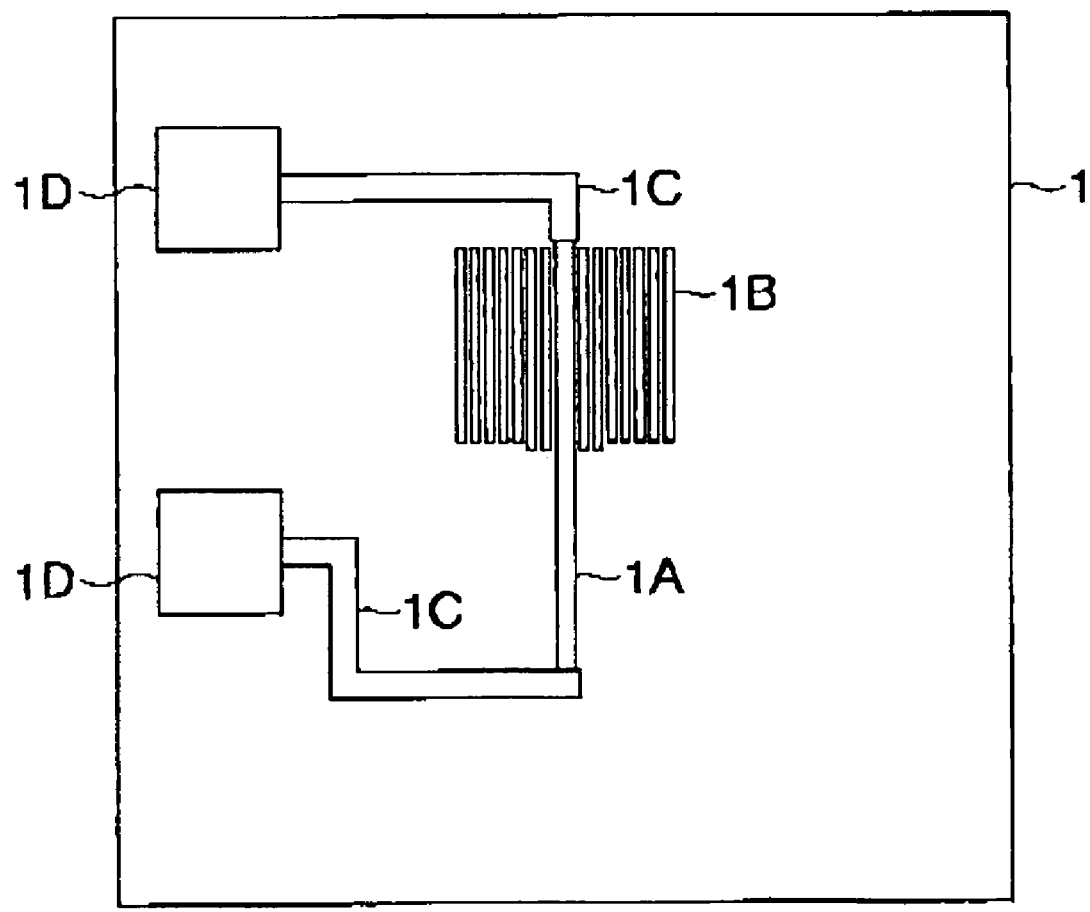

After the first layer interlayer insulation film 1 is formed, as shown in FIG. 3B, a wiring trench 1A, a dummy wiring trench group 1B, lead-out wiring trenches 1C, and electrode pad trenches 1D are formed by a photolithography technique on the first layer interlayer insulation film 1 (Step 202). To form the wiring trench 1A and so forth, first, a photoresist of chemically amplified type is applied on the first layer interlayer insulation film 1 while rotating the test wafer W. After the photoresist is applied, the test wafer is exposed to an ultraviolet ray such as i-ray or a far ultraviolet ray such as KrF or ArF using a mask in which a predetermined pattern is formed. Thereafter, the test wafer is developed by developing solution and a resist pattern is formed on the first layer interlayer insulation film 1. After the resist pattern is formed on the first layer interlayer insulation film 1, the first layer interlayer insulation film 1 is dry etched by a CF-based gas such as $CF_4$ or $CHF_3$ using the resist pattern as a mask, thereby forming the wiring trench 1A and so forth on the first layer interlayer insulation film 1. After the wiring trench 1A and so forth are formed on the first layer interlayer insulation film 1, the resist pattern is removed by ashing.

The wiring trench 1A and the electrode pad trenches 1D are formed to be connected via the lead-out wiring trenches 1C. By this process, on the simulation wiring pattern No. 6, the wiring trench 1A is formed to have a width of approximately 5.0 µm and a length of approximately 200 µm, and the dummy wiring trench group 1B is formed on both sides of the wiring trench 1A.

After the wiring trench 1A and so forth are formed on the first layer interlayer insulation film 1, a barrier metal film (not-shown) for restraining a diffusion of metal into the first layer interlayer insulation film 1 is formed on the first layer interlayer insulation film 1 by sputtering or the CVD for example. The barrier metal film is composed of a conductive material. Such a conductive material is composed of a metal having a smaller diffusion coefficient than that of the metal composing a first layer wiring 2A and so forth which will be described later, a metal nitride or the like. An example of such a metal is Ta, Ti or the like, and an example of the metal nitride is TiN, TaN, TiSiN, WN or the like. Incidentally, the barrier metal film may be formed by layering these materials.

After the barrier metal film is formed on the first layer interlayer insulation film 1, a seed film (not-shown) for passing an electric current during electrolytic plating is formed on the barrier metal film by the sputtering for example. The seed film is composed of a metal. An example of the metal is Cu or the like.

Figure 3C:
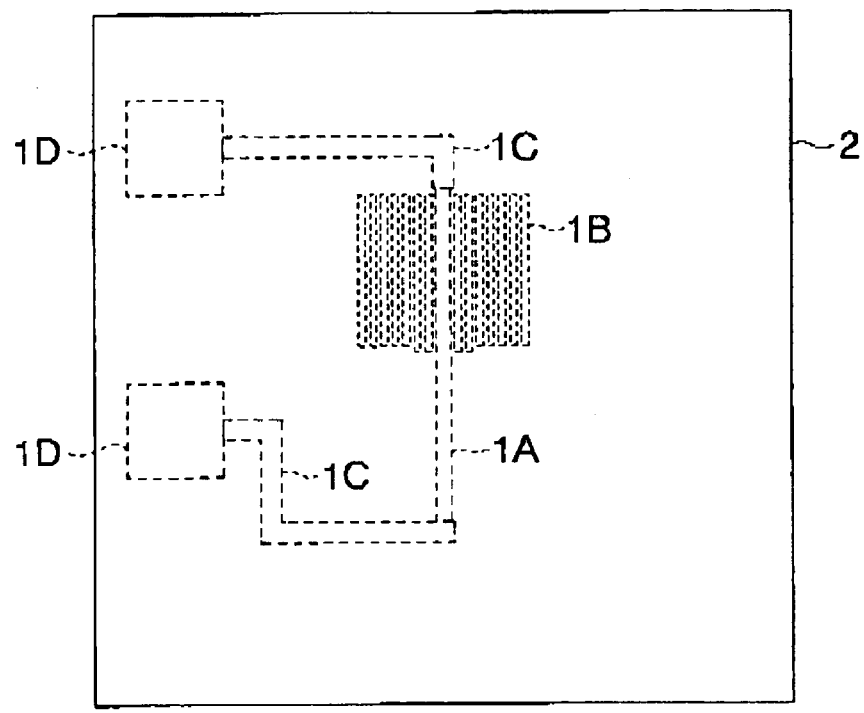

After the seed film is formed on the barrier metal film, as shown in FIG. 3C, a plating solution is provided on the test wafer W, and a plating film 2 is formed on the seed film by an electrolytic plating method (Step 203). Here, since the seed film is also formed inside the wiring trench 1A and so forth, the plating film 2 is also formed inside the wiring trench 1A and so forth. The plating film 2 is composed of a metal. An example of the metal is Cu or the like. Incidentally, the plating film 2 may be formed by an electroless plating method.

Figure 3D:
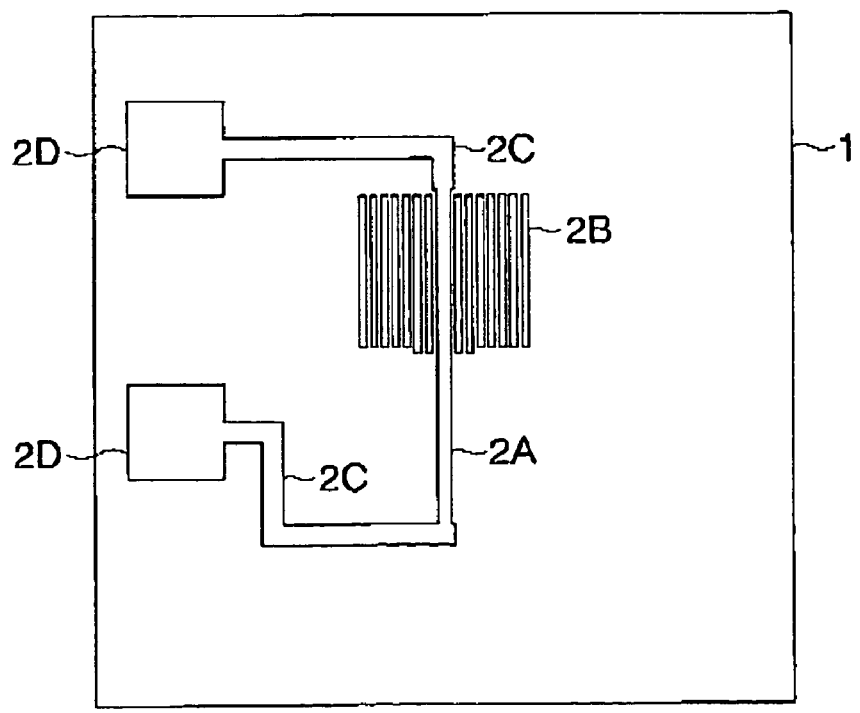

After the plating film 2 is formed, as shown in FIG. 3D, excess portions of the plating film 2 and the barrier metal film which exist on the first layer interlayer insulation film 1 are removed by Chemical Mechanical Polishing (CMP) for example, thereby forming the first layer wiring 2A, a first layer dummy wiring group 2B, first layer lead-out layers 2C, first layer electrode pads 2D, and so forth (Step 204). Specifically, the plating film 2 and the barrier metal film are polished by rotating the test wafer W and a polishing pad (not-shown) in a state that the test wafer W is in contact with the polishing pad, and by providing slurry on the test wafer W.

By this process, on the simulation wiring pattern No. 6, the first layer wiring 2A is formed to have a width of approximately 5.0 µm and a length of approximately 200 µm, and the first layer dummy wiring group 2B is formed on both sides of the first layer wiring 2A. Incidentally, the polishing technique is not limited to CMP, and other techniques may be used for polishing. An example of the other techniques is electrolytic polishing.

Figure 3E:
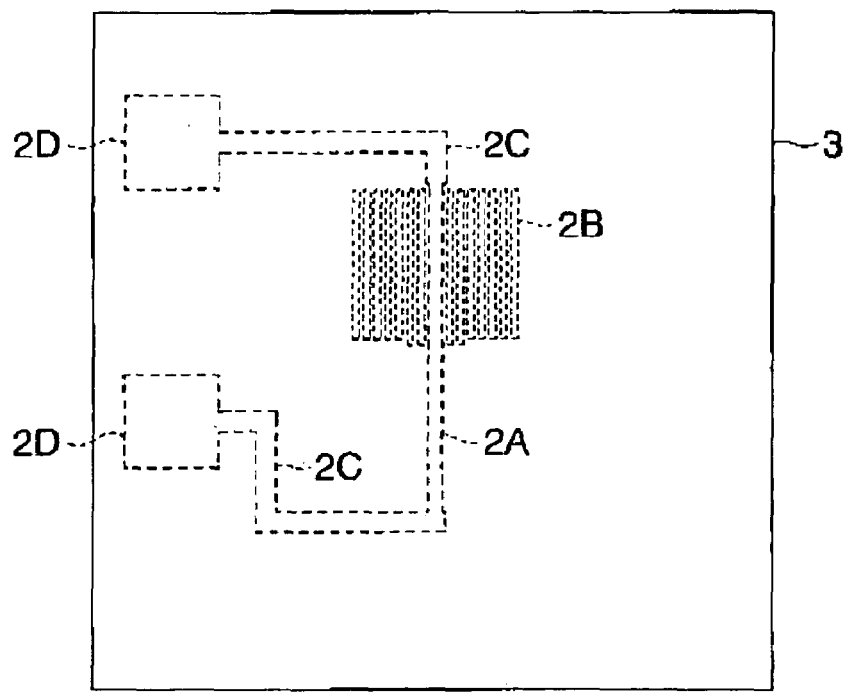

After the plating film 2 and so forth are removed and the first layer wiring 2A and so forth are formed, as shown in FIG. 3E, a second layer interlayer insulation film 3 is formed on the first layer interlayer insulation film 1 by the CVD or the coating method for example (Step 205).

Figure 3F:
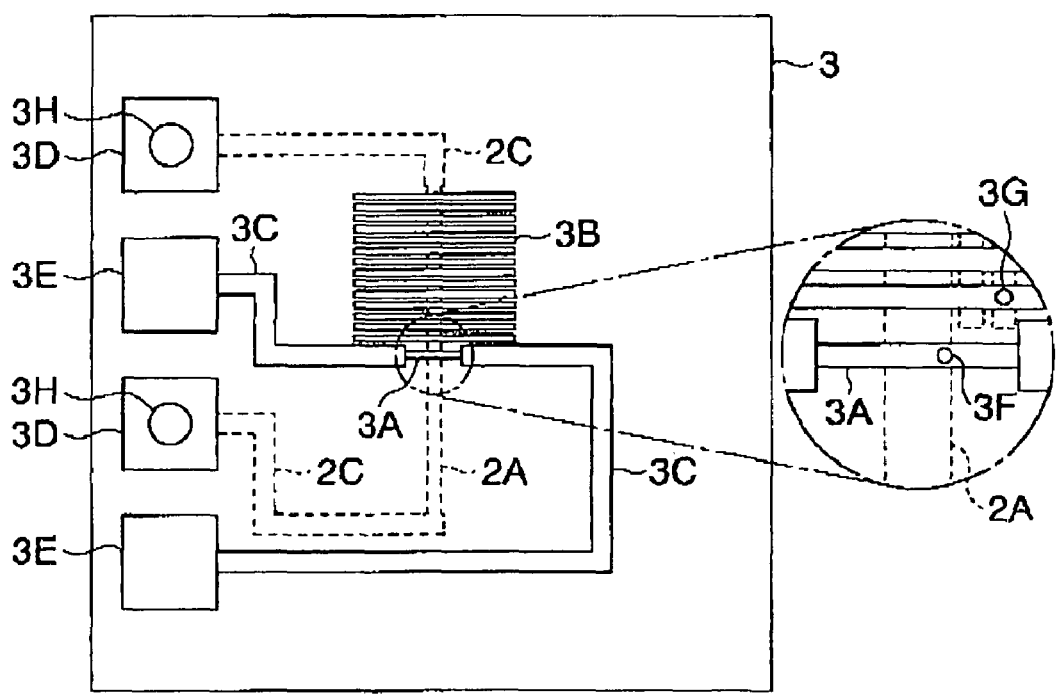

After the second layer interlayer insulation film 3 is formed, as shown in FIG. 3F, a wiring trench 3A, a dummy wiring trench group 3B, lead-out wiring trenches 3C, electrode pad trenches 3D and 3E, a via hole 3F, a dummy via hole 3G, and contact holes 3H are formed on the second layer interlayer insulation film 3 by the photolithography technique (Step 206).

The wiring trench 3A and the electrode pad trenches 3E are formed to be connected via the lead-out wiring trenches 3C. The wiring trench 3A is formed to three-dimensionally intersect the first layer wiring 2A, and the dummy wiring trench group 3B is formed to overlap the first layer dummy wiring group 2B. The contact holes 3H are for connecting the first layer electrode pads 2D and second layer electrode pads 4D which will be described later.

By this process, on the simulation wiring pattern No. 6, the wiring trench 3A is formed to have a width of approximately 0.3 µm and a length of approximately 20 µm, and the dummy wiring trench group 3B is formed on one side of the wiring trench 3A. Further, a via hole 3F is formed on a side of the first layer wiring 2A and at the center of the wiring trench 3A, and a dummy via hole 3G is formed.

After the wiring trench 3A and so forth are formed on the second layer interlayer insulation film 3, a barrier metal film (not-shown) for restraining a diffusion of metal into the second layer interlayer insulation film 3 is formed on the second layer interlayer insulation film 3 by the sputtering or the CVD for example.

Figure 3G:
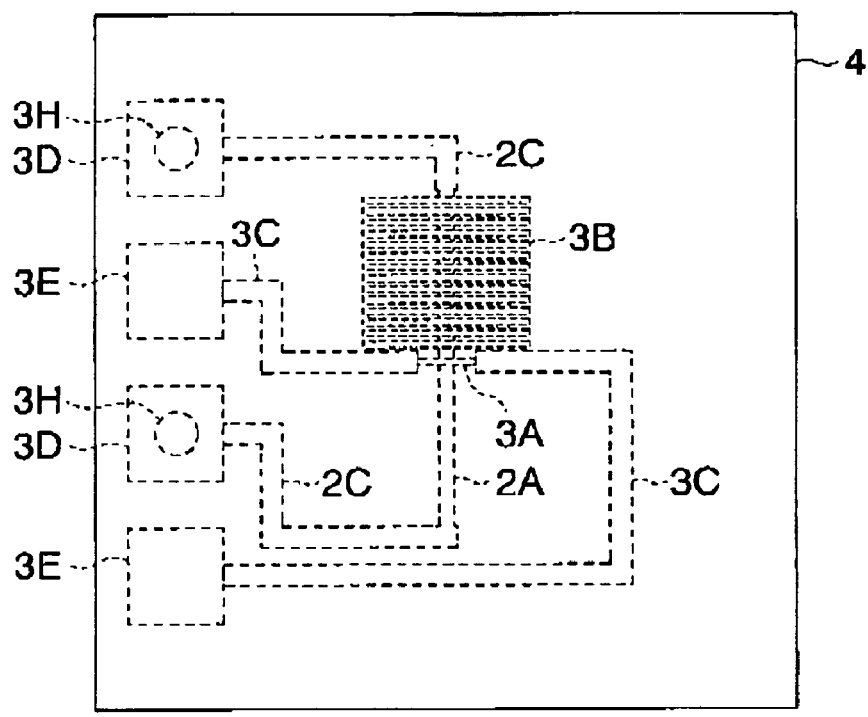

After the barrier metal film is formed on the second layer interlayer insulation film 3, a seed film (not-shown) for passing an electric current during electrolytic plating is formed on the barrier metal film by the sputtering for example. After the seed film is formed on the barrier metal film, as shown in FIG. 3G, a plating solution is provided on the test wafer W, and a plating film 4 is formed on the seed film by the electrolytic plating method (Step 207). Here, since the seed film is also formed inside the wiring trench 3A and so forth, the plating film 4 is also formed inside the wiring trench 3A and so forth.

Figure 3H:
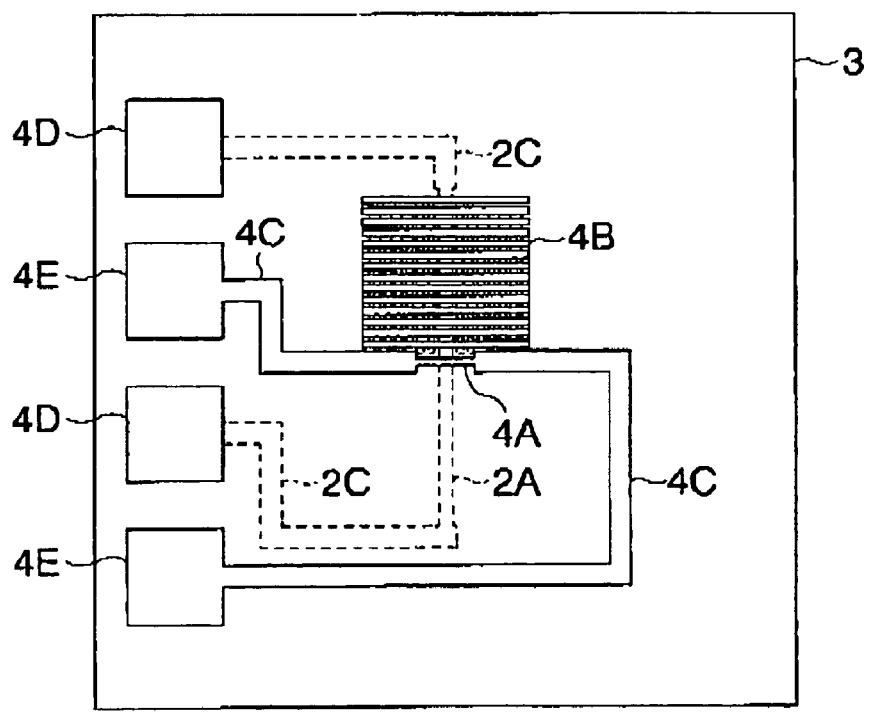

After the plating film 4 is formed, as shown in FIG. 3H, the wafer W is polished by, for example, the CMP to remove excess portions of the plating film 4 and the barrier metal film which exist on the second layer interlayer insulation film 3, thereby forming a second layer wiring 4A, a second layer dummy wiring group 4B, second layer lead-out layers 4C, second layer electrode pads 4D and 4E, and so forth (Step 208).

By this process, on the simulation wiring pattern No. 6, the second layer wiring 4A is formed to have a width of approximately 0.3 µm and a length of approximately 20 µm, and the second layer dummy wiring group 4B is formed on one side of the second layer wiring 4A.

Figure 3I:
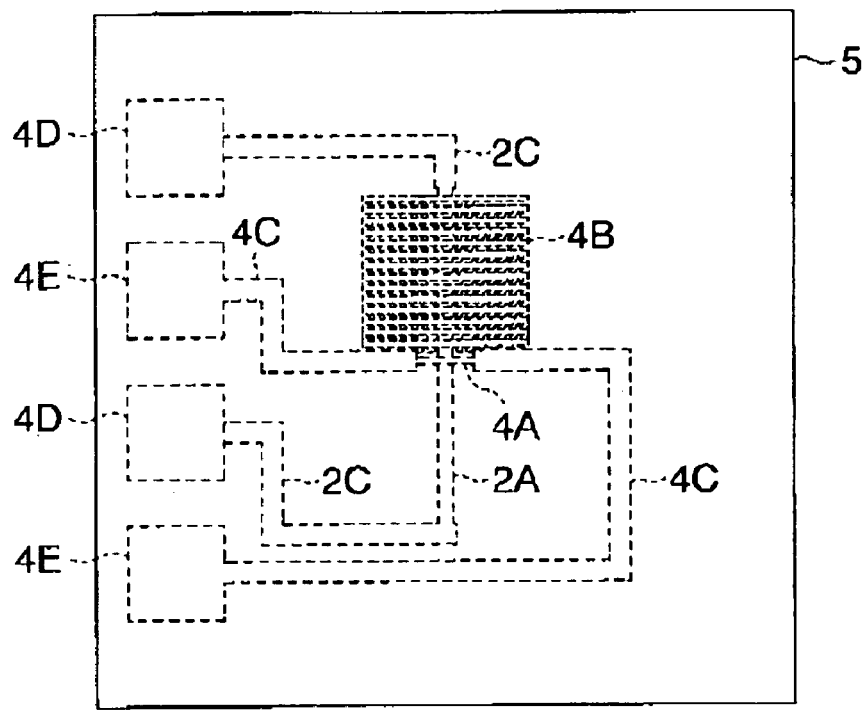

After the second layer wiring 4A and so forth are formed, as shown in FIG. 3I, a third layer interlayer insulation film 5 is formed on the second layer interlayer insulation film 3 by the CVD or the coating method for example (Step 209).

Figure 3J:
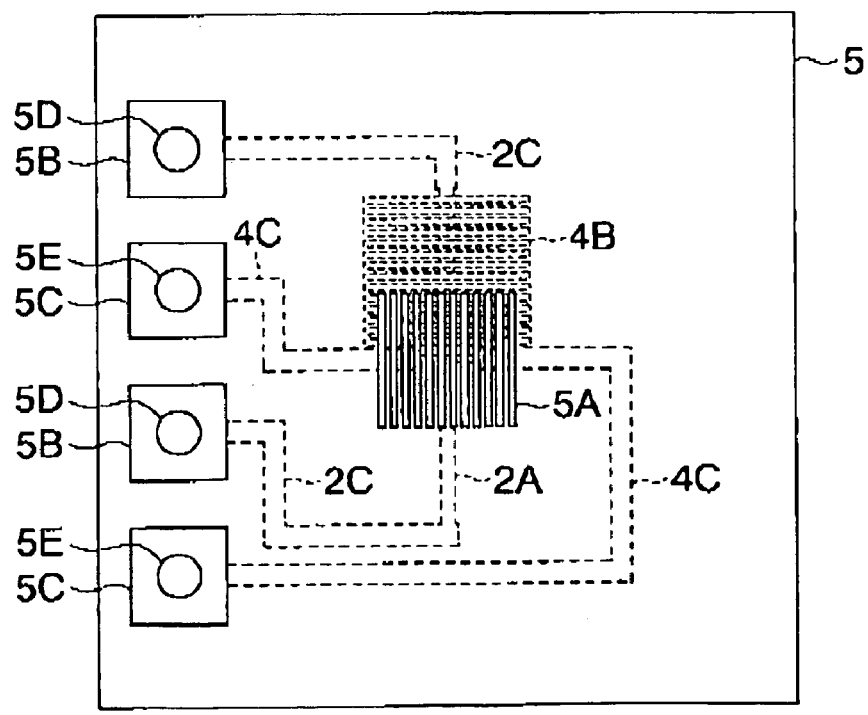

After the third layer interlayer insulation film 5 is formed, as shown in FIG. 3J, a wiring trench group 5A, electrode pad trenches 5B and 5C, and contact holes 5D and 5E are formed on the third layer interlayer insulation film 5 by the photolithography technique (Step 210).

The wiring trench group 5A is formed directly above the intersection of the first layer wiring 2A and the second layer wiring 4A, and formed in a square as a whole. The contact holes 5D are for connecting the second layer electrode pads 4D and third layer electrode pads 6B which will be described later, and the contact holes 5E are for connecting the second layer electrode pads 4E and third layer electrode pads 6C which will be described later. By this process, on the simulation wiring pattern No. 6, the wiring trench group 5A is formed in a square having a length of 50 µm on a side.

After the wiring trench group 5A and so forth are formed on the third layer interlayer insulation film 5, a barrier metal film (not-shown) for restraining a diffusion of metal into the third layer interlayer insulation film 5 is formed on the third layer interlayer insulation film 5 by the sputtering or the CVD for example.

After the barrier metal film is formed on the third layer interlayer insulation film 5, a seed film (not-shown) for passing an electric current during electrolytic plating is formed on the barrier metal film by the sputtering for example.

Figure 3K:
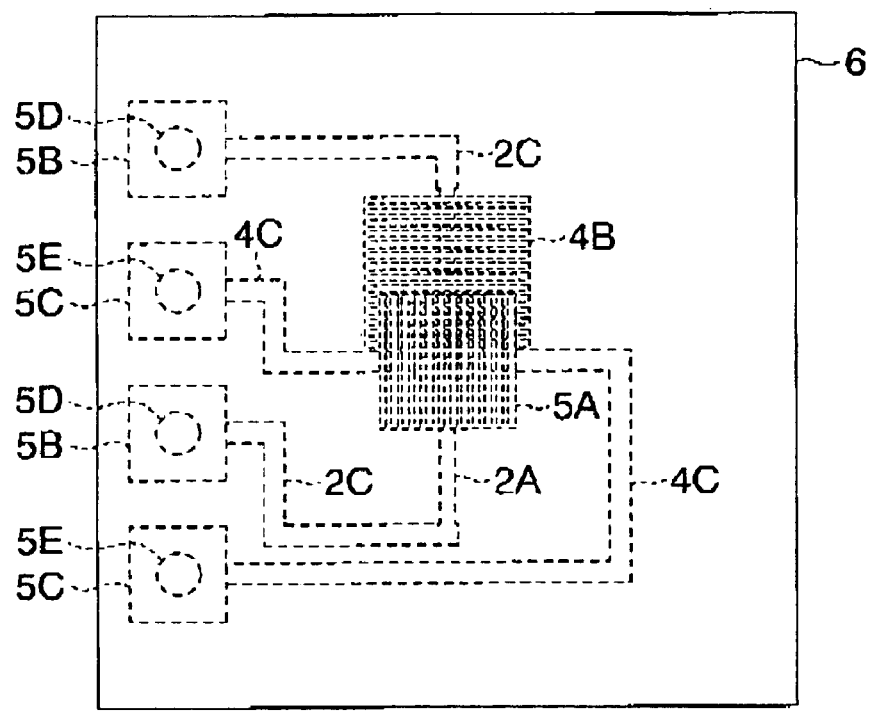

After the seed film is formed on the barrier metal film, as shown in FIG. 3K, a plating solution is provided on the test wafer W, and a plating film 6 is formed on the seed film by the electrolytic plating method (Step 211).

Figure 3L:
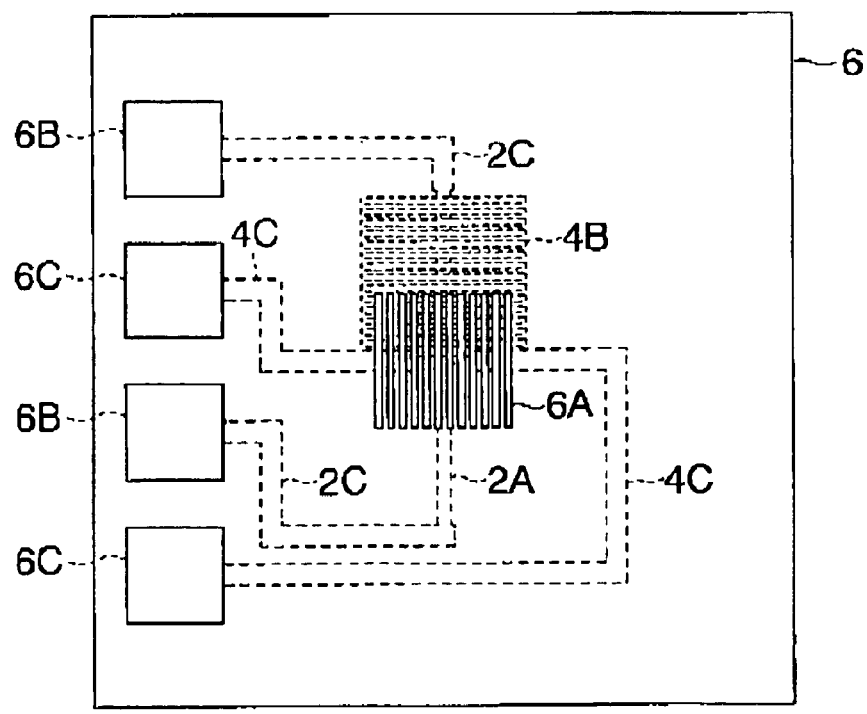

After the plating film 6 is formed, as shown in FIG. 3L, polishing is applied by, for example, the CMP to remove excess portions of the plating film 6 and the barrier metal film which exist on the third layer interlayer insulation film 5, thereby forming a third layer wiring group 6A, the third layer electrode pads 6B and 6C, and so forth (Step 212). By this process, on the simulation wiring pattern No. 6, the third layer wiring group 6A is formed in a square having a length of 50 µm on a side. The formed simulation wiring patterns No. 1 to No. 18 are in a state shown in FIG. 4.

Next, on the formed simulation wiring pattern aggregate, the respective test wafers W are evaluated to thereby detect the most suitable process condition for all the simulation wiring patterns No. 1 to No. 18 (Step 3). Specifically, probes (not-shown) are brought into contact with each of the third layer electrode pads 6B and 6C of the simulation wiring patterns No. 1 to No. 18 and an electric current is applied to the first layer wiring 2A and the second layer wiring 4A in order to measure a via resistance at the moment. Then, a statistical analysis is performed for each of the test wafers W based on the measured via resistance, thereby detecting the most suitable process condition for all the simulation wiring patterns No. 1 to No. 18.

Finally, the wiring pattern of the semiconductor integrated circuit is formed with the detected process condition (Step 4). Consequently, the wiring formation process of the semiconductor integrated circuit shown in FIG. 1 is completed.

According to this embodiment, a large number of simulation circuit patterns can be evaluated by the small number of simulation circuit patterns. Specifically, 4374 simulation wiring patterns exist by combining all the parameters. With respect to these patterns, in this embodiment, each of the states appears the same number of times in the respective parameters to make an orthogonal state, which makes it possible to achieve, only by forming and evaluating the 18 simulation wiring patterns No. 1 to No. 18, evaluation results approximately identical to those of simulation wiring patterns obtained by combining all the parameters. Therefore, a large number of simulation wiring patterns can be evaluated by the small number of simulation wiring patterns.

According to this embodiment, the yield of a semiconductor integrated circuit can be improved. Specifically, as described above, the evaluation results approximately identical to those of the simulation wiring patterns obtained by combining all the parameters can be achieved by evaluating the simulation wiring patterns No. 1 to No. 18, so that the process condition which is suitable for the simulation wiring patterns No. 1 to No. 18 is also suitable for the large number of simulation wiring patterns obtained by combining all the parameters. In this embodiment, the wiring pattern is formed with the process condition which is suitable for the simulation wiring patterns No. 1 to No. 18, so that the yield of the semiconductor integrated circuit can be improved.

EXAMPLE

Hereinafter, an example will be explained. In this example, a process condition is detected by using the same technique as that of the first embodiment, and an initial yield of fabricating semiconductor integrated circuits with the detected process condition is checked. Further, the process condition is modified thereafter by the same technique, and a yield of fabricating semiconductor integrated circuits with the modified process condition is also checked. Incidentally, as a comparison example for comparing with this example, a process condition is detected by using a conventional technique which mainly has reference states, and an initial yield of fabricating semiconductor integrated circuits with the detected process condition is checked. Further, the process condition is modified thereafter by the same technique, and a yield of fabricating semiconductor integrated circuits with the modified process condition is also checked.

Figure 5:
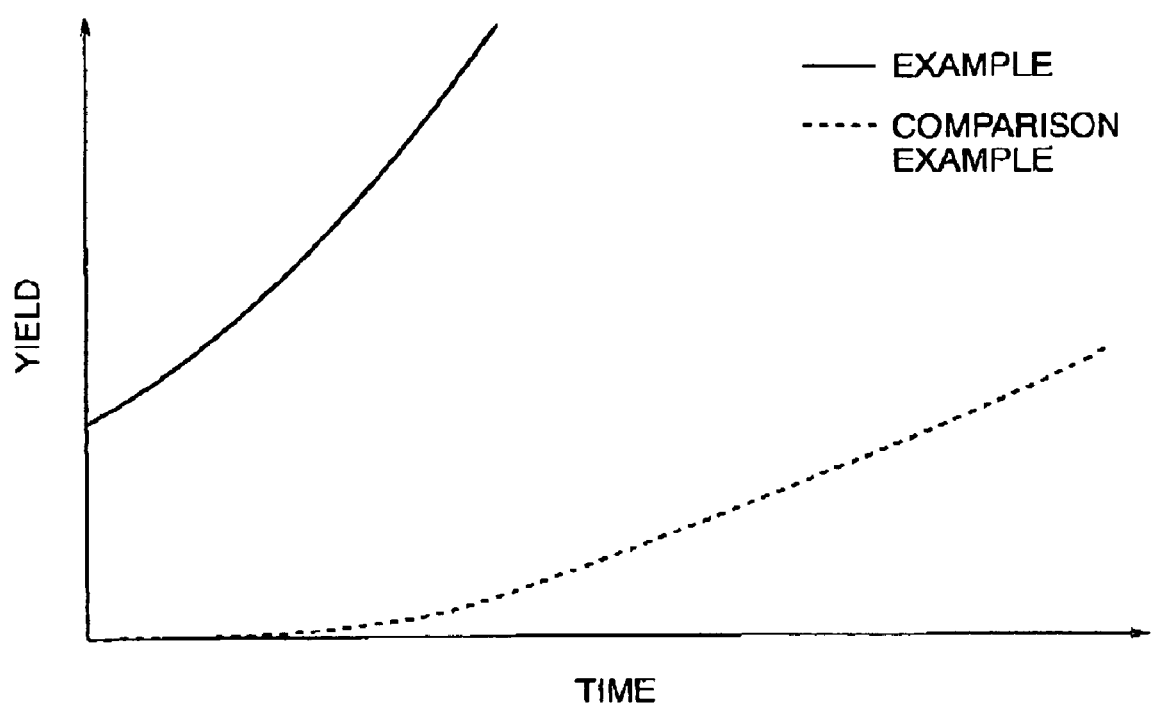
FIG. 5 is a graph representing a relation between a yield and a time according to an example.

Results will be explained below. FIG. 5 is a graph representing a relation between a yield and a time according to the example. As shown in FIG. 5, the initial yield in this example is higher than the initial yield in the comparison example. From this result, it is confirmed that the process condition detected by the technique in this example is suitable for circuit patterns in various shapes. Further, an improvement rate of the yield in this example is also higher than an improvement rate of the yield in the comparison example. From this result, it is confirmed that the technique in this example is also effective in the case of modifying the process condition.

Second Embodiment

Hereinafter, a second embodiment will be explained. In this embodiment, an example of applying the process condition detecting method explained in the above-described first embodiment to a transistor formation process will be explained.

First, an aggregate of simulation transistor patterns (hereinafter, referred to as a "simulation transistor pattern aggregate") which simulate transistor patterns of a semiconductor integrated circuit is designed (Step 1). The respective simulation transistor patterns are designed by combining plural parameters which define a geometrical structure in a transistor formation process. Table 3 represents combinations of the plural parameters.

TABLE 3

| K | L | M | N | O | P | Q | R | S |
|---|---|---|---|---|---|---|---|---|
| No. 1 | 40% | 1.0 µm | Island | 0.12 µm | 0.3 µm | 0.10 µm | Large | 0.1 µm |
| No. 2 | 40% | 1.0 µm | T shape | 0.15 µm | 0.5 µm | 0.11 µm | Medium | 0.2 µm |
| No. 3 | 40% | 1.0 µm | L shape | 0.20 µm | 1.0 µm | 0.12 µm | Small | 0.3 µm |
| No. 4 | 40% | 2.0 µm | Island | 0.15 µm | 0.3 µm | 0.11 µm | Small | 0.3 µm |
| No. 5 | 40% | 2.0 µm | T shape | 0.20 µm | 0.5 µm | 0.12 µm | Large | 0.1 µm |
| No. 6 | 40% | 2.0 µm | L shape | 0.12 µm | 1.0 µm | 0.10 µm | Medium | 0.2 µm |
| No. 7 | 40% | 5.0 µm | Island | 0.12 µm | 0.5 µm | 0.12 µm | Medium | 0.3 µm |
| No. 8 | 40% | 5.0 µm | T shape | 0.15 µm | 1.0 µm | 0.10 µm | Small | 0.1 µm |
| No. 9 | 40% | 5.0 µm | L shape | 0.20 µm | 0.3 µm | 0.11 µm | Large | 0.2 µm |
| No. 10 | 80% | 1.0 µm | Island | 0.20 µm | 1.0 µm | 0.11 µm | Medium | 0.1 µm |
| No. 11 | 80% | 1.0 µm | T shape | 0.12 µm | 0.3 µm | 0.12 µm | Small | 0.2 µm |
| No. 12 | 80% | 1.0 µm | L shape | 0.15 µm | 0.5 µm | 0.10 µm | Large | 0.3 µm |
| No. 13 | 80% | 2.0 µm | Island | 0.20 µm | 0.5 µm | 0.10 µm | Small | 0.2 µm |
| No. 14 | 80% | 2.0 µm | T shape | 0.12 µm | 1.0 µm | 0.11 µm | Large | 0.3 µm |
| No. 15 | 80% | 2.0 µm | L shape | 0.15 µm | 0.3 µm | 0.12 µm | Medium | 0.1 µm |
| No. 16 | 80% | 5.0 µm | Island | 0.15 µm | 1.0 µm | 0.12 µm | Large | 0.2 µm |
| No. 17 | 80% | 5.0 µm | T shape | 0.20 µm | 0.3 µm | 0.10 µm | Medium | 0.3 µm |
| No. 18 | 80% | 5.0 µm | L shape | 0.12 µm | 0.5 µm | 0.11 µm | Small | 0.1 µm |

K: Simulation transistor patter;
L: AA dummy density;
M: AA dummy size;
N: AA dummy shape;
O: Gate electrode formation width;
P: Gate electrode formation length;
Q: Contact hole diameter;
R: Degree of miss-alignment;
S: STI formation width As shown in Table 3, in this embodiment, eight parameters are used to form a simulation transistor pattern aggregate which is composed of simulation transistor patterns No. 1 to No. 18. As the parameters, "active area dummy density (AA dummy density)," "active area dummy size (AA dummy size)," "active area dummy shape (AA dummy shape)," "gate electrode formation width," "gate electrode formation length," "contact hole diameter," "degree of miss-alignment" and "shallow trench isolation formation width (STI formation width)" are used.

Each of the parameters has at least two states. The "active area dummy density" has two states: "40%" and "80%." The "active area dummy size has three states: "1.0 µm," "2.0 µm" and "5.0 µm." The "active area dummy shape has three states: "Island," "T shape" and "L shape."

The "gate electrode formation width" has three states "0.12 µm," "0.15 µm" and "0.20 µm." The "gate electrode formation length" has three states "0.3 µm," "0.5 µm" and "1.0 µm."

The "contact hole diameter" has three states: "0.10 µm," "0.11 µm" and "0.12 µm." The "degree of miss-alignment" has three states: "large," "medium" and "small." The "shallow trench isolation formation width" has three states: "0.1 µm," "0.2 µl" and "0.3 µm."

The respective states appear the same number of times in the respective parameters. For example, in the "active area dummy density," the states "40%" and "80%" respectively appear nine times, and in the "active area dummy size," the states "1.0 µm," "2.0 µm" and "5.0 µm" respectively appear six times. In the other parameters, "active area dummy shape," "gate electrode formation width," "gate electrode formation length," "contact hole diameter," "degree of miss-alignment" and "shallow trench isolation formation width," the respective states also appear the same number of times.

Next, the designed simulation transistor pattern aggregate is formed on test wafers. When forming such a simulation transistor pattern aggregate, plural test wafers are prepared, and the simulation transistor pattern aggregate is formed on each of the test wafers with a process condition which is different for each of the test wafers.

Thereafter, on the formed simulation transistor pattern aggregate, the respective test wafers are evaluated to thereby detect the most suitable process condition for all the simulation transistor patterns No. 1 to No. 18. Finally, the transistor patterns of the semiconductor integrated circuit are formed with the detected process condition.

Third Embodiment

Hereinafter, a third embodiment will be explained. In this embodiment, an example will be explained in which a state that is not suitable for a predetermined process condition is respectively detected in each of parameters, and a wiring pattern is formed so as not to have these states that are not suitable.

First, a simulation wiring pattern aggregate identical to that of the above-described first embodiment is designed. Next, the designed simulation wiring pattern aggregate is formed on a test wafer W. Here, in this embodiment, the simulation wiring pattern aggregate is formed on one test wafer W with the predetermined process condition.

Thereafter, on the formed simulation wiring pattern aggregate, the respective simulation wiring patterns are evaluated to thereby detect the state that is not suitable in each of the parameters. Specifically, similarly to the first embodiment, probes (not-shown) are brought into contact with each of third layer electrode pads 6B and 6C of simulation wiring patterns No. 1 to No. 18 and an electric current is applied to a first layer wiring 2A and a second layer wiring 4A in order to measure a via resistance at the moment. Then, a statistical analysis is performed for each of the wiring patterns based on the measured via resistance, and the state that is not suitable for the predetermined process condition is respectively detected in each of the parameters.

Finally, the wiring pattern is designed so as not to have the state that is not suitable for the predetermined process condition, and the designed wiring pattern is formed with the predetermined process condition.

It should be noted that the present invention is not limited to the described contents in the aforementioned embodiments, and the structure, the materials, the arrangement of respective members, and the like can be appropriately modified within a range which does not depart from the contents and purpose of the present invention. For example, the process condition detecting method of the present invention is applied to the wiring formation process in the aforementioned first embodiment, and the process condition detecting method of the present invention is applied to the transistor formation process in the aforementioned second embodiment, but the process condition detecting method can be applied to other processes when they are manufacturing processes of a semiconductor integrated circuit.

The eight parameters are used to design the simulation wiring patterns in the aforementioned first embodiment, and the eight parameters are used to design the simulation transistor patterns in the second embodiment, but the number of parameters is not limited to eight.

The simulation wiring pattern aggregate is composed of the 18 simulation wiring patterns in the aforementioned first and third embodiments, and the simulation transistor pattern aggregate is configured from the 18 simulation transistor patterns in the second embodiment, but the number of patterns is not limited to 18.

What is claimed is:

1. A simulation circuit pattern evaluation method, comprising:
    designing an aggregate of simulation circuit patterns, which simulate a circuit pattern of a semiconductor integrated circuit, by combining plural geometrical structure defining parameters including at least any one of a dummy wiring group formation position and an existence of a dummy via hole, the plural geometrical structure defining parameters respectively having at least two states, in such a manner that the respective states appear the same number of times in the respective geometrical structure defining parameters;
    forming the aggregate of simulation circuit patterns on a substrate; and
    evaluating the formed aggregate of the simulation circuit patterns,
    wherein said forming includes forming the aggregate of the simulation circuit patterns on each of a plurality of the substrates with a process condition which is different for each of the substrates; and
    wherein said evaluating includes separately evaluating the aggregate of the simulation circuit patterns on each of the substrates.

2. The simulation circuit pattern evaluation method as set forth in claim 1,
    wherein the geometrical structure defining parameters are parameters which define a geometrical structure of a wiring.

3. The simulation circuit pattern evaluation method as set forth in claim 2,
wherein the parameters which define the geometrical structure of the wiring further include at least any one of a wiring formation width, a wiring formation length, a via hole formation position, and a wiring group formation length.

4. A manufacturing method of a semiconductor integrated circuit, comprising:
designing an aggregate of simulation circuit patterns, which simulate a circuit pattern of a semiconductor integrated circuit, by combining plural geometrical structure defining parameters including at least any one of a dummy wiring group formation position and an existence of a dummy via hole, the plural geometrical structure defining parameters respectively having at least two states, in such a manner that the respective states appear the same number of times in the respective geometrical structure defining parameters;
forming the aggregate of the simulation circuit patterns on each of plural substrates with a process condition which is different for each of the substrate;
detecting a process condition which is suitable for the aggregate of the simulation circuit patterns by separately evaluating the formed aggregate of the simulation circuit patterns on each of the substrate; and
forming the circuit pattern with the detected process condition.

5. The manufacturing method of a semiconductor integrated circuit as set forth in claim 4,
wherein the geometrical structure defining parameters are parameters which define a geometrical structure of a wiring.

6. The manufacturing method of a semiconductor integrated circuit as set forth in claim 5,
wherein the parameters which define the geometrical structure of the wiring further include at least any one of a wiring formation width, a wiring formation length, a via hole formation position, and a wiring group formation length.

7. A test substrate, comprising:
an aggregate of simulation circuit patterns which is formed by combining plural geometrical structure defining parameters including at least any one of a dummy wiring group formation position and an existence of a dummy via hole, the plural geometrical structure defining parameters respectively having at least two states, in such a manner that the respective states appear the same number of times in the respective geometrical structure defining parameters, the aggregate of the simulation circuit patterns simulating a circuit pattern of a semiconductor integrated circuit.

8. The test substrate as set forth in claim 7,
wherein the geometrical structure defining parameters are parameters which define a geometrical structure of a wiring.

9. The test substrate as set forth in claim 8,
wherein the parameters which define the geometrical structure of the wiring further include at least any one of a wiring formation width, a wiring formation length, a via hole formation position, and a wiring group formation length.

10. A test substrate group which is composed of plural test substrates respectively including an aggregate of simulation circuit patterns which is formed by combining plural geometrical structure defining parameters including at least any one of a dummy wiring group formation position and an existence of a dummy via hole, the plural geometrical structure defining parameters respectively having at least two states, in such a manner that the respective states appear the same number of times in the respective geometrical structure defining parameters, the aggregate of the simulation circuit patterns simulating a circuit pattern of a semiconductor integrated circuit, the aggregate of the simulation circuit patterns being formed with a process condition which is different for each of the test substrate.

11. The test substrate group as set forth in claim 10,
wherein the geometrical structure defining parameters are parameters which define a geometrical structure of a wiring.

12. The test substrate group as set forth in claim 11,
wherein the parameters which define the geometrical structure of the wiring further include at least any one of a wiring formation width, a wiring formation length, a via hole formation position, and a wiring group formation length.

* * * * *